United States Patent
Schlicker et al.

(10) Patent No.: US 8,152,595 B2
(45) Date of Patent: Apr. 10, 2012

(54) SYSTEM AND METHOD FOR OPTICAL ENDPOINT DETECTION DURING CMP BY USING AN ACROSS-SUBSTRATE SIGNAL

(75) Inventors: Mike Schlicker, Hirschfeld (DE); Gerd Marxsen, Radebeul (DE)

(73) Assignee: Advanced Micro Devices Inc., Austin, TX (US)

( * ) Notice: Subject to any disclaimer, the term of this patent is extended or adjusted under 35 U.S.C. 154(b) by 587 days.

(21) Appl. No.: 12/366,271

(22) Filed: Feb. 5, 2009

(65) Prior Publication Data
US 2009/0275264 A1 Nov. 5, 2009

(30) Foreign Application Priority Data
Apr. 30, 2008 (DE) .......................... 10 2008 021 569

(51) Int. Cl.
*B24B 49/00* (2012.01)
(52) U.S. Cl. .................. 451/5; 451/6; 451/285; 451/11; 451/41; 451/287
(58) Field of Classification Search .................. 451/6, 8, 451/11, 41, 285–289
See application file for complete search history.

(56) References Cited

U.S. PATENT DOCUMENTS

| | | | | |
|---|---|---|---|---|
| 4,502,253 A * | 3/1985 | Lorenzi et al. | | 451/6 |
| 5,609,511 A * | 3/1997 | Moriyama et al. | | 451/5 |
| RE35,703 E * | 12/1997 | Koch et al. | | 324/230 |
| 6,077,783 A * | 6/2000 | Allman et al. | | 438/691 |
| 6,271,047 B1 * | 8/2001 | Ushio et al. | | 438/14 |
| 6,641,470 B1 * | 11/2003 | Zhao et al. | | 451/523 |
| 6,669,539 B1 * | 12/2003 | Amartur | | 451/57 |
| 6,707,540 B1 * | 3/2004 | Lehman et al. | | 356/72 |
| 6,869,332 B2 * | 3/2005 | Redeker et al. | | 451/6 |
| 6,878,038 B2 * | 4/2005 | Johansson et al. | | 451/6 |
| 7,008,297 B2 * | 3/2006 | Johansson et al. | | 451/6 |
| 7,024,268 B1 * | 4/2006 | Bennett et al. | | 700/121 |
| 7,025,658 B2 * | 4/2006 | David | | 451/5 |
| 7,500,901 B2 * | 3/2009 | Swedek et al. | | 451/5 |
| 7,682,221 B2 * | 3/2010 | Swedek et al. | | 451/5 |
| 2001/0039064 A1 | 11/2001 | Ushio et al. | | 438/14 |
| 2003/0045100 A1 | 3/2003 | Saka et al. | | 438/689 |
| 2003/0176081 A1 * | 9/2003 | Redeker et al. | | 438/784 |
| 2004/0259470 A1 | 12/2004 | Swedek et al. | | 451/5 |
| 2006/0025052 A1 * | 2/2006 | Birang et al. | | 451/5 |

FOREIGN PATENT DOCUMENTS

| DE | 60116757 T2 | 7/2006 |
|---|---|---|
| DE | 102007015502 A1 | 10/2008 |

OTHER PUBLICATIONS

Translation of Official Communication from German Patent Office for German Patent Application No. 10 2008 021 569.4-43 dated Feb. 17, 2011.
Translation of Official Communication from German Patent Office for German Patent Application No. 10 2008 021 569.4-43 dated Dec. 18, 2008.

* cited by examiner

*Primary Examiner* — George Nguyen
(74) *Attorney, Agent, or Firm* — Williams, Morgan & Amerson (57) ABSTRACT

In a polishing process, the characteristics of the removal process may be monitored at different lateral positions to identify the clearance of the various device regions with a high degree of reliability. Consequently, upon forming sophisticated metallization structures, undue over-polishing may be avoided while at the same time providing reduced leakage currents due to enhanced material removal.

24 Claims, 9 Drawing Sheets

SYSTEM AND METHOD FOR OPTICAL ENDPOINT DETECTION DURING CMP BY USING AN ACROSS-SUBSTRATE SIGNAL

BACKGROUND OF THE INVENTION

1. Field of the Invention

Generally, the subject matter disclosed herein relates to the field of manufacturing integrated circuits, and, more particularly, to chemical mechanical polishing (CMP) processes used for planarizing process layers, such as metallization structures, when removing the excess metal using a polishing process.

2. Description of the Related Art

Typically, the fabrication of modern integrated circuits requires a large number of individual process steps, wherein a typical process sequence involves the deposition of conductive, semiconductive or insulating layers on an appropriate substrate. After deposition of the corresponding layer, device features are produced by patterning the corresponding layer with well-known means, such as photolithography and etching. As a consequence, by patterning a deposited layer, a certain topography will be created that also affects deposition and patterning of subsequent layers. Since sophisticated integrated circuits require the formation of a plurality of stacked layers, it has become standard practice to periodically planarize the surface of the substrate to provide well-defined conditions for deposition and patterning of subsequent material layers. This holds true especially for so-called metallization layers in which metal interconnects are formed to electrically connect the individual device features, such as transistors, capacitors, resistors and the like, thereby establishing the functionality required by the circuit design.

In this respect, CMP has become a widely used process technique for reducing "imperfections" in the substrate topography caused by preceding processes in order to establish enhanced conditions for a subsequent process, such as photolithography and the like. The polishing process itself causes mechanical damage to the polished surface, however, in an extremely low range, i.e., at an atomic level, depending on the process conditions. CMP processes also have a plurality of side effects that have to be addressed so as to be applicable to processes required for forming sophisticated semiconductor devices.

For example, recently, the so-called damascene or inlaid technique has become a preferred method of forming metallization layers, wherein a dielectric layer is deposited and patterned to receive trenches and vias that are subsequently filled with an appropriate metal, such as aluminum, copper, copper alloys, silver, tungsten and the like. Since the process of providing the metal may be performed as a "blanket" deposition process based on, for instance, electrochemical deposition techniques, the respective pattern of the dielectric material may require a significant over-deposition in order to reliably fill narrow openings and wide regions or trenches in a common deposition process. The excess metal is then removed and the resulting surface is planarized by performing a process sequence comprising one or more mechanical polishing processes, which also include a chemical component. Chemical mechanical polishing (CMP), or generally planarization, has proven to be a reliable technique to remove the excess metal and planarize the resulting surface so as to leave behind metal trenches and vias that are substantially electrically insulated from each other as required by the corresponding circuit layout. Chemical mechanical polishing typically requires the substrate to be attached to a carrier, a so-called polishing head, such that the substrate surface to be planarized is exposed and may be placed against a polishing pad. The polishing head and polishing pad are moved relative to each other usually by individually moving the polishing head and the polishing pad. Typically, the head and pad are rotated against each other while the relative motion is controlled to locally achieve a target material removal rate for a given chemical reaction rate that is substantially determined by the composition of the slurry and the characteristics of the material(s) to be removed.

One problem involved in the chemical mechanical polishing of substrates is the very different removal rates of differing materials, such as of a metal and a dielectric material, from which the excess metal has to be removed. For instance, at a polishing state where the dielectric material and the metal are simultaneously treated, i.e., after the major portion of the metal has already been removed, the removal rate for the metal exceeds the removal rate for the dielectric material. This may be desirable, to a certain degree, because all metal is reliably ablated from all insulating surfaces, thereby insuring the required electrical insulation. On the other hand, significant metal removal from trenches and vias may result in a trench or via that exhibits an increased electrical resistance due to the reduced cross-sectional area. Moreover, the local removal rate may significantly depend on the local structure, i.e., on the local pattern density of the device features in a specific die area, which may result in a locally varying degree of erosion of the dielectric material in a final state of the polishing process. In order to more clearly demonstrate a typical CMP process in the context of a damascene process, reference is made to FIGS. 1a-1f.

Figure 1A:
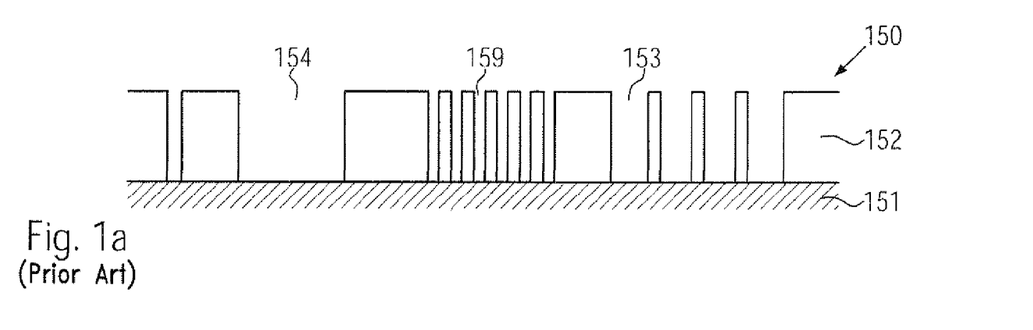
FIGS. 1a-1c schematically illustrate cross-sectional views of a semiconductor device during various manufacturing stages in forming an advanced metallization structure using a CMP process for removing excess material.
Figure 1B:
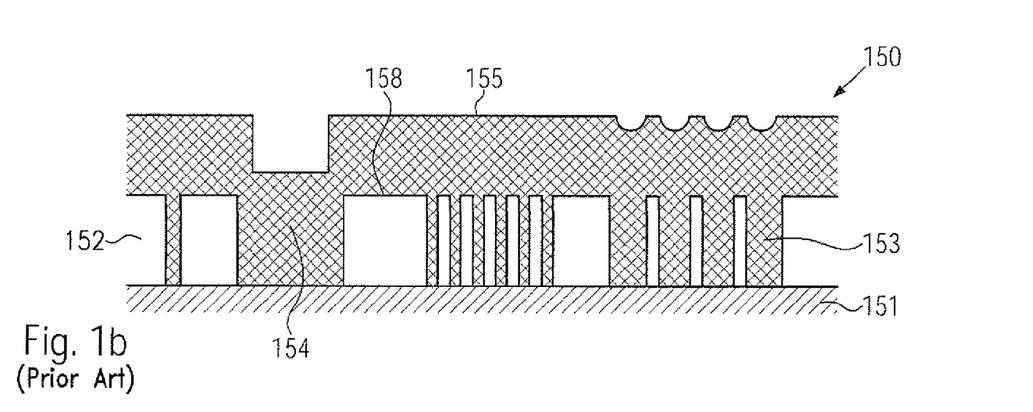
Figure 1C:
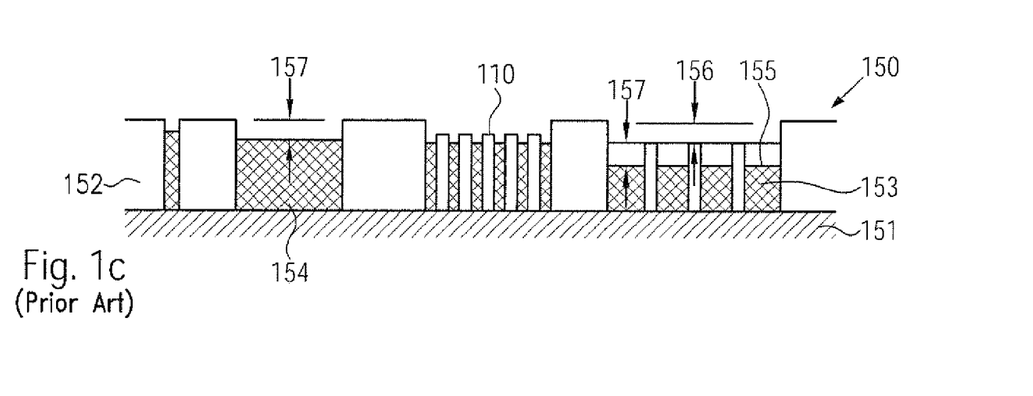

FIGS. 1a-1c schematically show cross-sectional views of a semiconductor structure 150 at various stages in fabricating a metallization layer according to a typical damascene process sequence.

In FIG. 1a, the semiconductor structure 150 comprises a substrate 151 bearing circuit features (not shown) and an insulating cap layer on which metal lines are to be formed. A patterned dielectric layer 152 is formed over the substrate 151 and includes openings, for example in the form of narrow trenches 153 and wide trenches 154. The dielectric layer 152 may also comprise closely-spaced openings 159. The openings for the trenches 153, 159 and 154 are patterned in conformity with design rules to establish metal lines exhibiting the required electrical characteristics in terms of functionality and conductivity. The openings 153, 154 and 159 may represent device regions of different pattern density, i.e., the number of device features, such as metal lines to be formed in the openings 153, 154, 159, per unit area of the regions substantially defined by the respective openings 153, 154, 159, respectively, is different. For example, the opening 154, representing a wide trench, may be considered as a region of reduced pattern density compared to a region accommodating the trenches 159. The deposition of the dielectric material 152 as well as the patterning of the trenches 153, 159 and 154 is carried out by well-known deposition, etching and photolithography techniques.

FIG. 1b schematically depicts the semiconductor structure 150 after deposition of a metal layer 155, for example a copper layer, when sophisticated integrated circuits are considered. As is evident from FIG. 1b, the topography of the metal layer 155 will be affected by the underlying pattern of the dielectric layer 152. The metal layer 155 may be deposited by chemical vapor deposition, sputter deposition or, as usually preferred with copper, by electroplating with a preceding sputter deposition of a corresponding copper seed layer. Although the precise shape of the surface profile of the metal layer 155 may depend on the deposition technique used, in principle, a surface shape will be obtained as shown in FIG. 1b.

Subsequently, the semiconductor structure 150 will be subjected to the chemical mechanical polishing in which, as previously mentioned, the slurry and polishing pad are selected to efficiently remove the excess metal in the metal layer 155. During the chemical mechanical polishing, the excess metal is removed and, finally, surface portions 158 of the dielectric material 152 will be increasingly exposed, wherein it is necessary to continue the polishing operation for a certain over-polish time to ensure clearance of the metal from all insulating surfaces in order to avoid any electrical shorts or leakage paths between adjacent metal lines. As previously mentioned, the removal rate of the dielectric material and the metal may differ significantly from each other so that, upon over-polishing the semiconductor structure 150, the copper in the trenches 153, 159 and 154 will be recessed.

FIG. 1c schematically shows a typical result of chemical mechanical polishing of the structure shown in FIG. 1b. As is evident from FIG. 1c, during over-polishing the semiconductor structure 150, different materials are simultaneously polished with different removal rates. The removal rate is also dependent to some degree on the underlying pattern. For instance, the recessing of the metal lines during the over-polish time, which is also referred to as dishing, as well as the removal of the dielectric material, also referred to as erosion, is significantly affected by the type of pattern to be polished. In FIG. 1c, dishing and erosion at the wide trenches 154, as indicated by 157 and 156, respectively, are relatively moderate, whereas, at the narrow lines 153, dishing 157 and erosion 156 are significantly increased. For obtaining a required electrical conductivity, circuit designers have to take into consideration a certain degree of dishing and erosion, which may not be compatible with sophisticated devices.

Therefore, complex control strategies are typically used in advanced CMP tools in order to generate in situ measurement data for estimating an appropriate end point of the polishing process and/or control the uniformity of the polishing process. For example, a measurement signal indicative of the average layer may be monitored in order to determine the average removal rate during the process and/or to identify an appropriate point in time for terminating the process. To this end, optical measurement techniques, such as spectroscopic ellipsometry or other reflectivity measurement techniques, may be used. Since the optical probing of the substrate surface is difficult, due to the nature of the polishing process, significant efforts have been made to provide appropriate CMP tools comprising optical measurement capabilities. For this purpose, appropriately configured polishing pads and platens have been developed that allow optical access to the substrate surface during polishing. This may be accomplished by providing respective transparent windows in the pad. Respective optical measurement data may, therefore, be obtained for a plurality of dielectric materials and very thin metal layers during polishing, thereby enabling efficient control and endpoint detection strategies.

Figure 1D:
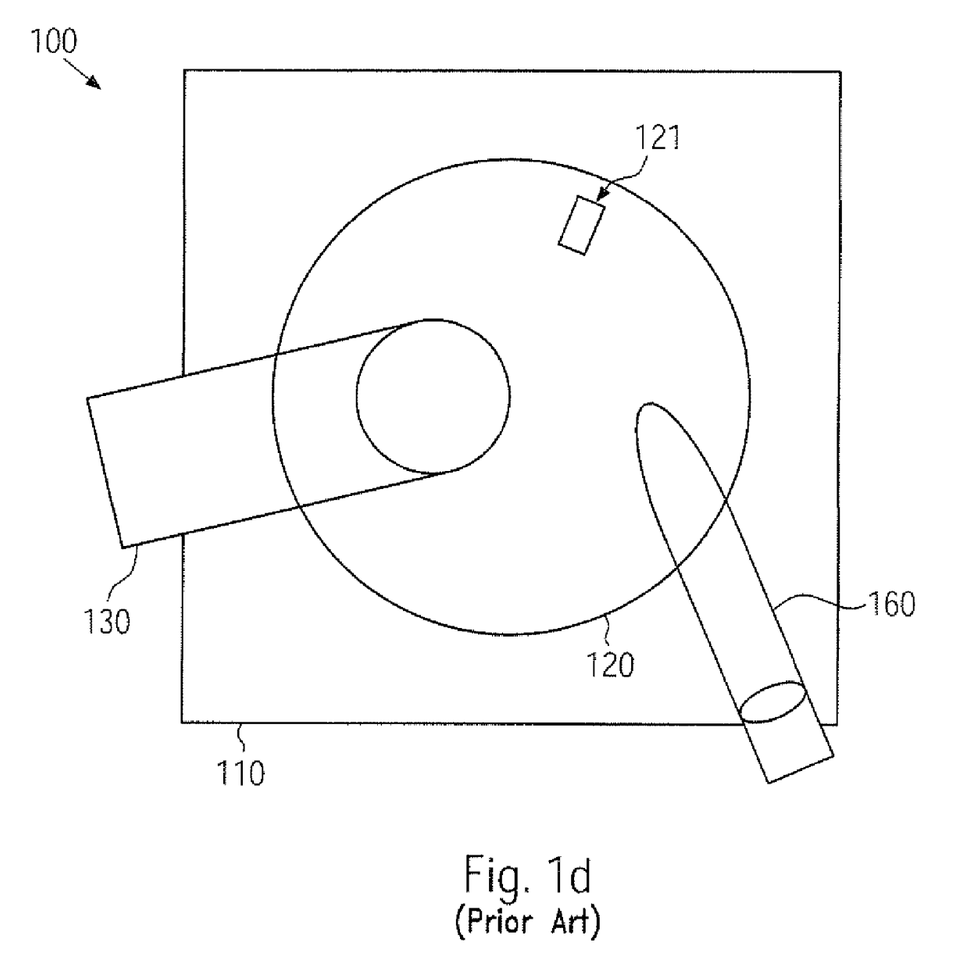
FIGS. 1d-1e schematically illustrate a top view and cross-sectional view, respectively, of a conventional polishing tool including an optical endpoint detection system for providing an averaged reflectance curve used to identify clearance of a surface to be treated, according to conventional strategies.

FIG. 1d schematically illustrates a top view of a CMP tool 100 comprising a frame 110 configured to accommodate a polishing platen 120, a polishing head 130 and a pad conditioner 160, as well as any respective mechanical, electrical and other components for operating the components 120, 130 and 160. It should be appreciated that the platen 120 is rotatably supported by appropriate drive assemblies (not shown) that are configured to provide a controllable rotation of the platen 120 in accordance with process parameters. Similarly, the polishing head 130 is configured, in combination with suitable mechanical, electrical, hydraulic, pneumatic and other components, to receive a substrate, such as the semiconductor substrate 151, and to rotate the substrate relative to the polishing platen 120 in accordance with the specified process parameters, wherein a specific downforce may be applied to the substrate for obtaining the desired interaction with a corresponding polishing pad (not shown in FIG. 1d), in combination with a suitable slurry substance, such as a chemical component and the like. Similarly, the pad conditioner 160 is connected to an appropriate drive assembly in order to provide the desired positioning of a respective conditioning surface (not shown) above the polishing platen 120, thereby allowing an efficient reworking of the corresponding pad surface in order to enhance uniformity of process conditions throughout the processing of a plurality of substrates. The polishing tool 100 further comprises a window 121 formed in the polishing platen 120 in which an optical transparent material may be provided to enable optical access of a surface to be treated during the operation of the polishing tool 100.

Figure 1E:
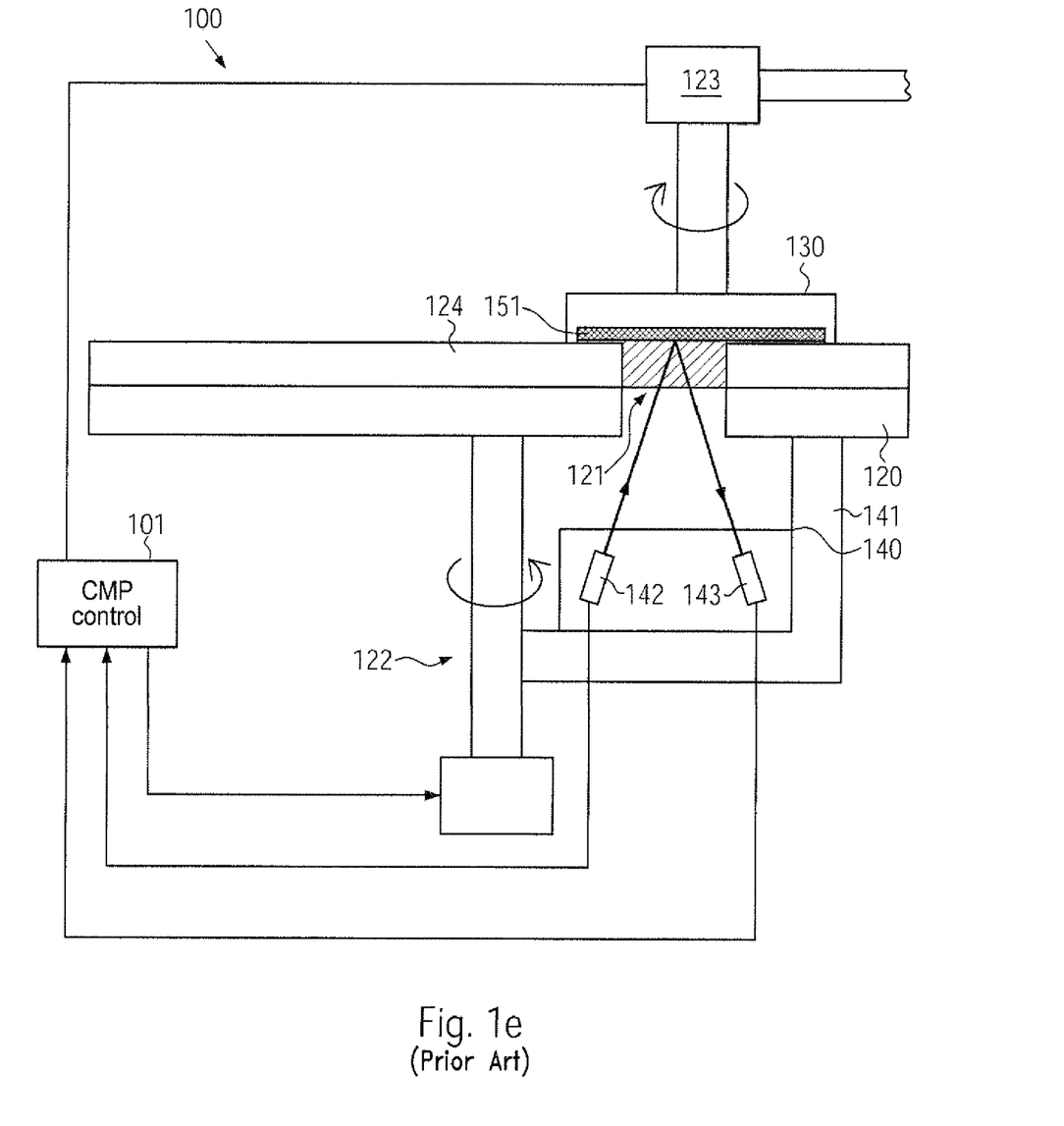

FIG. 1e schematically illustrates the polishing tool 100 in a schematic cross-sectional view, wherein an optical measurement system 140 is arranged below the window portion 121. The optical system 140 may be attached to a support member 141, which in turn may be mechanically coupled to a drive assembly 122 that is configured to rotate the polishing platen 120. The optical system 140 comprises a light source 142 configured to emit a light beam and to direct the same to the surface of the substrate 151 that is currently being processed. Moreover, the optical system 140 includes a detector 143 configured and arranged to receive a light beam reflected by the surface of the substrate 151. The respective light beams may be received through a substantially transparent material provided in the window portion 121, as previously explained. The light source 142 and the detector 143 are coupled to a CMP control unit 101, which is configured to evaluate the signal obtained from the detector 143 and, if required, to appropriately drive the light source 142. The control unit 101 is further configured to control the drive assembly 122 connected to the polishing platen 120 and also to control a drive assembly 123 connected to the polishing head 130. Furthermore, the control unit 101 may control movement of the pad conditioner 160.

During operation of the polishing tool 100, the substrate 151 may be loaded onto the polishing head 130 on the basis of well-known components, such as robot handlers and the like, wherein the polishing head 130 may itself be configured to provide the respective substrate handling and transport activities within the polishing tool 100. Furthermore, the substrate 151 loaded onto the polishing head 130 may be brought into a respective operating position and the corresponding relative motion between the polishing platen, i.e., a respective pad 124 attached thereto, and the polishing head 130 is established on the basis of the drive assemblies 122 and 123. Prior to and/or during the relative motion, an appropriate slurry substance (not shown) is supplied to the surface of the pad 124, wherein the slurry material may include a chemical agent or any other component for enhancing the overall removal rate or providing enhanced surface conditions during the corresponding polishing process. The pad conditioner 160 (see FIG. 1d) may be continuously or temporarily in contact with the corresponding polishing surface of the pad 124 in order to "rework" the respective surface structure. During operation of the polishing tool 100, the window portion 121 may pass the substrate surface, thereby providing an optical response to a light beam provided by the light source 142, which is received by the detector 143, which may provide a measurement signal to the control unit 101 indicating the reflectance of the surface portion illuminated by the light source 142. For example, when removing material of the metal layer 155 (see FIG. 1b), an initial reflectance of the layer 155 may be moderately high, due to the optical characteristics of the material of the layer 155 and due to a moderately pronounced overall surface topography obtained after the deposition of the layer 155, as previously explained. Upon removing material of the layer 155, the initial surface topography may be reduced, thereby enhancing the intensity of the reflected light beam, which may then remain substantially stable as long as the entire substrate surface is covered by the highly reflective material of the layer 155. In a final phase of the polishing process, surface portions of the substrate 151 may be increasingly cleared, thereby typically reducing the average reflectivity due to the different optical characteristics of the material 152 (FIGS. 1a-1c) compared to the material 155. Thus, the reduction in reflectance may be used as an indication of the status of the polishing process.

Figure 1F:
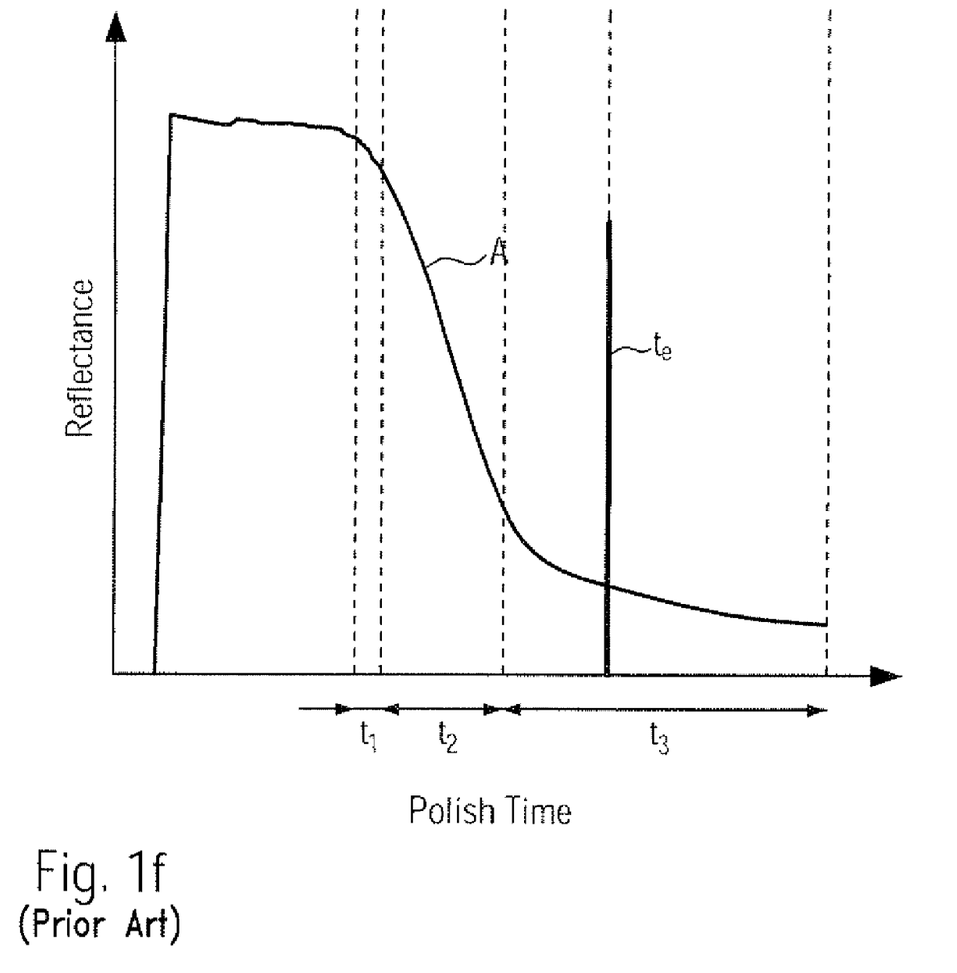
FIG. 1f schematically illustrates a respective measurement signal indicating the reflectance of a metal surface during a final phase of the polishing process in order to determine an appropriate endpoint, according to conventional techniques.

FIG. 1f schematically illustrates the time variation of a measurement signal obtained by the optical sensor system 140 of FIG. 1e during a final phase of the polishing process. As shown, the horizontal axis represents the polish time, while the vertical axis indicates the average reflectance, for instance the intensity of the reflected light beam received by the detector 143. Curve A represents the reflectance values over time, wherein, at a time interval $t_1$, the reflectance begins to significantly decrease, thereby indicating that portions of the dielectric layer 152 are being exposed. Thus, during the time interval $t_2$, a significant drop of the average reflectance may be observed, which may finally terminate into a tail portion of curve A corresponding to an interval $t_3$ and having a significantly reduced slope, thereby indicating only minor changes in the optical surface characteristics of the layer 152 in combination with the residues of the metal layer 155. During the time interval $t_3$, however, a significant degree of dishing and erosion, as indicated by 156, 157 in FIG. 1c, may occur while other device areas may still require further material removal to provide substantially electrically isolated metal features, as previously explained. Thus, within the time interval $t_3$, an appropriate point of time $t_e$ may be identified which may be considered as the end of the polishing process, thereby providing the desired electrical isolation of the metal feature, while attempting to not unduly over-polish the device 150. The definition of the endpoint of the polishing process may therefore have to "cover" the entire process window of the polishing process under consideration in order to substantially avoid undesired leakage currents caused by non-removed metal residues, while also maintaining device non-uniformities at a moderately low level, which may be caused by erosion and dishing effects. However, an appropriate definition of the endpoint, for instance in combination with appropriate process parameters at the final phase of the polishing process, may be difficult to be determined, in particular when the pattern density across the die regions have a wide distribution, as is, for instance, shown with respect to the wide trench 154 and the narrow lines and metal regions 156, 159 (FIGS. 1a-1c). Consequently, although optical endpoint detection provides enhanced process control, sophisticated device geometries may result in a less pronounced indication of clearance of the entire substrate, thereby possibly requiring additional over-polish times, which may lead to non-uniformities of metal lines with respect to resistivity and surface planarity.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to polishing tools and techniques for enhancing process control during the removal of material on the basis of a polishing process by using a measurement signal providing information on the removal status across a certain radial distance, thereby allowing the assessment of material removal at various different radial positions of the surface to be treated. For example, in some illustrative aspects disclosed herein, an appropriate measurement signal, for instance in the form of an object measurement signal, an electrical signal and the like, may be obtained across a die region or, in other illustrative embodiments, across a significant distance of the substrate diameter, may be gathered, thereby allowing the depth determination of an endpoint of the removal process with increased accuracy, even for sophisticated surface topographies, thereby reducing the necessity for providing additional over-polish time, while at the same time reducing the risk of affecting device characteristics by remaining material residues, for instance in terms of leakage currents between neighboring metal features when excess metal of a metal layer or any other conductive material is to be removed.

One illustrative method disclosed herein comprises performing a removal process for removing material from a material layer formed above a substrate by moving the substrate relative to a polishing pad, wherein the substrate comprises a plurality of die regions. The method further comprises obtaining a measurement signal for each of a plurality of measurement positions laterally distributed across the substrate during the removal process, wherein the plurality of measurement positions extend in a lateral direction according to a measurement distance that corresponds at least to a lateral dimension of one of the plurality of die regions. The method additionally comprises determining an endpoint of the removal process on the basis of a change of the measurement signal from each of the plurality of measurement positions.

A further illustrative method disclosed herein relates to determining an endpoint of a polishing process. The method comprises determining a response of a substrate to a probe signal for a plurality of radially different measurement positions. Furthermore, the method comprises determining a time variation of the response and indicating the endpoint when the time variation of the response is less than a predetermined threshold.

One illustrative polishing system disclosed herein comprises a polishing tool comprising a polishing head for receiving a substrate and a polishing platen, wherein the polishing tool is configured to establish a relative motion between the polishing head and the polishing platen. The polishing system further comprises a detection system configured to provide a probe signal and to receive a response to the probe signal during the relative motion. Moreover, the polishing system comprises a control unit operatively connected to the polishing tool and the detection system and configured to control the polishing tool and the detection system to obtain the response to the probe signal for a plurality of radially different measurement positions. Furthermore, the control unit is configured to monitor a time variation of the response for the plurality of measurement positions.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein addresses the issue of increased device non-uniformity and/or performance degradation caused by sophisticated CMP processes, providing an advanced in situ process monitoring on the basis of a measurement signal, providing increased reliability in detecting an endpoint of the removal process. As previously explained, complex polishing processes for removing excess material and planarizing the surface topography may require a precise control of the status of the removal process, in particular at the final phase, to enable a desired substantially complete removal of non-desired material residues while at the same time not unduly over-polishing device regions in which the material may have already been removed due to a difference in surface topography, non-uniformity of a preceding deposition process and the like. For example, during the removal of excess metal, such as copper, in sophisticated metallization systems of a semiconductor device, a reliable monitoring of the remaining amount of copper material at the final phase of the removal process may be important so as to obtain a reliable endpoint detection indication without undue non-uniformity of the resulting metal features, while at the same time maintaining leakage currents between adjacent metal features at a required low level. For this purpose, an appropriate endpoint detection signal, such as an optical signal, an electrical signal and the like, may be obtained from a plurality of laterally different measurement positions so that information may be obtained and evaluated with respect to the status of the material removal process, thereby enabling a more reliable identification of a substantially complete clearance of the surface under consideration. For example, by obtaining an appropriate measurement signal from a plurality of measurement positions distributed across a lateral dimension of a die region, the substantially complete clearance of the die region may be estimated more reliably since the various areas of the die region may be assessed individually, which may therefore enable the appropriate determination of an appropriate endpoint, for instance by monitoring the time variation of the signal or signal portions related to the respective laterally different measurement positions. In other illustrative embodiments, a significant portion of the lateral extension of the substrate may be monitored in this manner, for instance across a radius or the entire diameter of the substrate, depending on the overall measurement strategy, thereby even enabling the determination of an appropriate endpoint signal in view of across-substrate non-uniformities, which may result from previous processes or from the removal process itself. That is, upon monitoring endpoint signals at various radial positions across a significant portion of the substrate diameter, non-uniformities of the initial layer thickness and/or of locally varying removal rates across the substrate diameter may be detected and hence the endpoint detection signals may be used for defining an appropriate endpoint of the removal process, while maintaining an over-polishing of respective device regions at a moderately low level. Furthermore, in some illustrative embodiments, the locally resolved endpoint detection signal may be used for adapting process parameters during the processing of subsequent substrates, for instance by adjusting the local removal rate on the basis of the previously obtained spatially resolved endpoint detection signal. That is, when the locally resolved endpoint detection signals may indicate an early clearance of the substrate center for any substrates still to be processed, a preceding deposition process and/or the removal process may be controlled to provide increased uniformity, that is, the initial deposition thickness may be increased at the substrate center and/or the local removal rate may be reduced at the substrate center on the basis of the locally resolved endpoint detection signal. Consequently, the endpoint detection techniques disclosed herein may provide superior control of each individual polishing process and may also provide enhanced overall process and device uniformity by providing feedback measurement data for the processing of further substrates still to be processed, for instance by depositing a material layer and removal excess material thereof by a removal process, such as CMP, electro-CMP and the like.

It should be appreciated that the subject matter disclosed herein may be applied to polishing tools, such as (electro) chemical mechanical polishing tools and the like, used for the fabrication of highly complex semiconductor devices, such as CPUs, memory chips and the like, in which the surface topography has to be planarized on a regular basis for providing the required surface conditions for subsequent processes, such as lithography processes and the like. In illustrative embodiments, advanced metallization structures may be formed, as is, for instance, described with reference to FIGS. 1a-1c, in order to electrically connect circuit elements, such as transistors and the like, having critical dimensions of approximately 50 nm and less. Hence, in this case, sophisticated device geometries may be encountered in which pattern density may vary significantly across a die region, while also, due to the fabrication of substrates of increased diameters, such as 300 mm, 450 mm and the like, across-substrate non-uniformities may occur. The subject matter disclosed herein may also be applied to any situation in which polishing tools may be used, at least temporarily, for the removal of any materials, such as conductive materials, insulating materials and the like, from respective substrate surfaces, wherein undue over-polishing may have to be suppressed while at the same time reliably removing unwanted portions of the material under consideration. Thus, unless specifically pointed out in the specification or the appended claims, the subject matter disclosed herein should not be considered as being restricted to polishing processes for forming metallization layers.

Figure 2A:
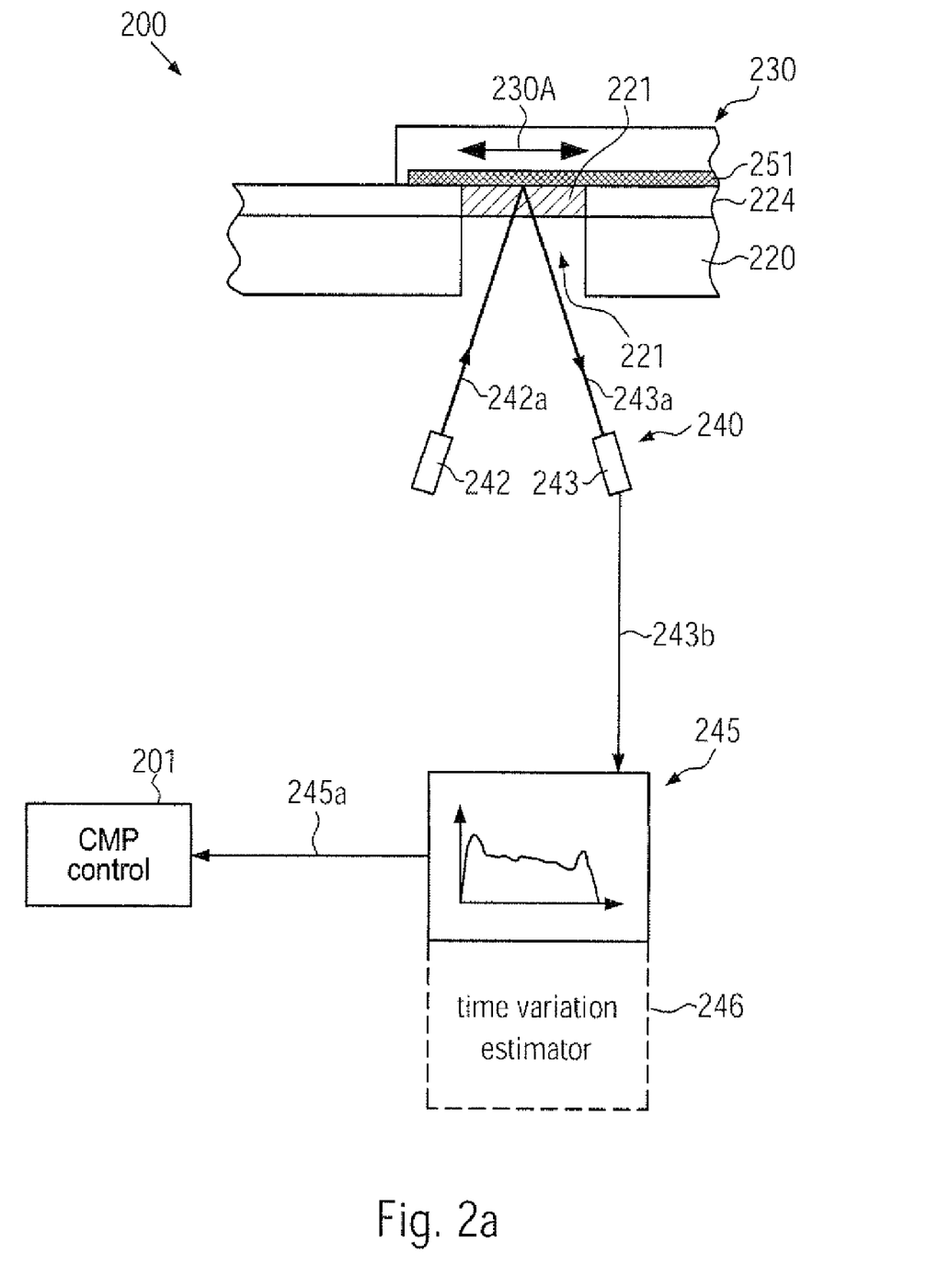
FIG. 2a schematically illustrates a cross-sectional view of a portion of a polishing tool comprising a detection system for obtaining a position-dependent measurement signal for estimating the degree of clearance in different radial positions, according to illustrative embodiments.

FIG. 2a schematically illustrates a cross-sectional view of a portion of a polishing tool 200, which may represent a CMP tool, an electro-CMP tool, or any other polishing tool and the like. The polishing tool 200 may comprise a frame, a plurality of drive assemblies and the like, as is similarly explained with reference to the polishing tool 100. The polishing tool 200 as illustrated may comprise a polishing head 230 configured to receive a substrate 251 which may have a surface to be polished, as is, for instance, described above and which is also described with reference to the semiconductor device 150. Furthermore, a polishing platen 220 may comprise a polishing pad 224 which, in the embodiment shown, may have a window portion 221 configured to enable optical access of a portion of the surface of the substrate 251 by means of a detection system 240. Thus, in the embodiment shown, the detection system 240 may comprise a light source 242, which is to be understood as any appropriate radiation source for delivering electromagnetic radiation which may extend beyond the visible range, depending on the overall process requirements. Thus, the light source 242 may provide an appropriate beam 242a having the desired characteristics, for instance with respect to wavelength, divergence and convergence, respectively, polarization, and the like. Moreover, the detection system 240 may comprise a detector or receiver 243 configured to obtain a response signal 243a, for instance in the form of an optical signal and the like. The detection system 240 may be configured to create, in combination with the overall configuration of the polishing tool 200, for instance the window portion 221 and the control unit 201 for obtaining the response 243a in a spatially resolved manner to enable the detection of a response of an exposed surface portion of the substrate 251 to the probing signal 242a, as will be discussed later on in more detail.

The detection system 240 may further comprise a control unit 245 configured to at least receive a signal 243b indicative of the response signal 243a received by the detector 243. For example, the signal 243b may represent an electrical signal corresponding to at least one characteristic of the measurement signal 243a, such as an intensity of a specific wavelength range or a specific polarized portion and the like. As will be discussed later on in more detail, the detection system 240 may comprise, in addition or alternatively to optical components for probing an exposed portion of the substrate 251 by an optical probe signal, other components, such as components for determining in a locally resolved manner an inductive and/or capacitive coupling caused by the current status of the substrate surface to be treated. The control unit 245 may be configured to receive the signal 243b and to extract information relating to the polishing status of the substrate 251 for at least some gradually different measurement positions. Furthermore, the control unit 245 may further be configured to estimate the time variation of the position-dependent information extracted from the signal 243b, thereby enabling the identification of an appropriate endpoint of a polishing process, which may be signaled to the control unit 201 by means of an endpoint detection signal 245a. To this end, the control unit 245 may include a time variation estimator 246 which may be configured to monitor the progression in time of at least one characteristic of the information for each of the different radial measurement positions in order to identify a state in which the time variation is less than a predefined threshold, thereby indicating a substantially stable condition of the respective measurement position.

Figure 2B:
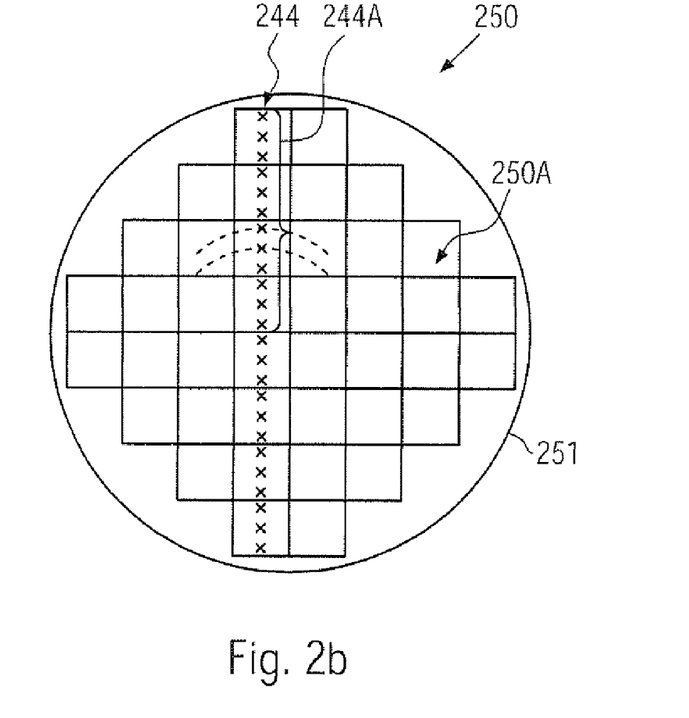
FIG. 2b schematically illustrates a top view of a semiconductor substrate including a plurality of die regions, wherein a plurality of radially different measurement positions may be evaluated during a polishing process, according to illustrative embodiments.

FIG. 2b schematically illustrates a device 250 which may represent any appropriate substrate 251 in combination with a plurality of die regions 250A, which may represent functional entities that may have to be separated in a later manufacturing stage. For instance, the die regions 250A may represent integrated circuits, or any other microstructure features, including sophisticated individual elements, such as circuit elements and the like. For example, the device 250 may represent the device 150 as previously explained, in which the die regions 250A may receive a material layer on the basis of a pronounced surface topography, which may have to be planarized by removing excess material of the material layer on the basis of the polishing tool 200. In some illustrative embodiments, the device 250 may represent a semiconductor device receiving a metallization structure, as is described with reference to FIGS. 1a-1c. That is, the substrate 251 may have formed thereon the material layer 152 with respective openings, such as the openings 154, 153, 159, followed by a metal layer, such as the layer 155. In other cases, any other appropriate material layers may be formed within the die regions 250A according to specified design rules for the device 250. Typically, the die regions 250A may be arranged in accordance with a specified grid, wherein the number of the individual die regions 250A may depend on the size of the substrate 251 and the required size for each of the die regions 250A.

Referring to FIGS. 2a and 2b, upon operation of the polishing tool 200, the substrate 251 may be attached to the polishing head 230 so that the die regions 250A, having formed thereon the material layer, such as the layer 155, may come into contact with the polishing pad 224. Furthermore, appropriate polishing parameters, such as relative speed between the pad 224 and the substrate 251, and a downforce, in combination with the characteristics of a slurry material, may be selected in accordance with process requirements, as previously explained. Depending on the overall configuration of the polishing tool 200, i.e., the detection system 240 may be attached to the platen 220 or may represent a stationary configuration, the probe signal 242a may be generated in an appropriate manner so as to allow a scanning of a plurality of radially different positions across the substrate 251. As is, for instance, shown in FIG. 2b, the detection system 240 may provide the probe signal 242a so as to "probe" a plurality of positions 244 across a significant distance 244A along a radial direction of the substrate 251. It should be appreciated that the plurality of radially different measurement positions 244 may not necessarily be arranged along a substantially straight line as indicated in FIG. 2b, but may actually represent any radial position, which may also include an averaging of positions around a circle or a section of a circle corresponding to the respective radial distance under consideration. That is, depending on the overall scan strategy in obtaining the response 243a from the plurality of measurement positions 244, the radial distance may be adjusted, for instance, by appropriately varying the position of the polishing head 230, as indicated by the arrow 230A, while the radial position 230A may be maintained for a certain time interval, thereby obtaining the response 243a along a section of a circle, due to the rotational movement of the platen 220. If desired, by providing sufficiently short time intervals for obtaining the response 243a at a specific radial position, a substantially "point-like" measurement position may be defined, if the time interval for taking the response 243a is significantly smaller than the corresponding circumferential speed of the "measurement point" under consideration. For example, by taking into consideration the relative speed between the substrate 251 and the platen 220, if desired, a substantially straight line of radially different measurement positions 244 may be achieved. That is, the frequency of obtaining a response within a short time interval for a specific radial position may be matched with a frequency with which a specified die region is exposed by the window portion 221.

In one illustrative embodiment, the measurement distance 244A extends at least across one die region 250A, thereby enabling the detection of the polishing status across at least one die region 250A, which may enable the identification of an appropriate endpoint of the polishing process for the respective die region 250A. For example, a representative die region 250A may be selected in advance, which may provide an appropriate endpoint detection signal, which may also be representative of the other die regions 250A if across-substrate non-uniformities are considered less relevant. In other illustrative embodiments, the measurement distance 244A may extend across a plurality of die regions 250A and may, in some illustrative embodiments, span at least the radius of the substrate 251. This may be advantageous to obtain respective information across the entire substrate 251, if the individual measurement positions 244 may be averaged over one substantially complete rotation of the substrate 251, since, in this case, each of the positions 244 may represent the averaged status of a complete circle, the radius of which may correspond to the lateral position under consideration. In other illustrative embodiments, the time interval for taking the response 243a may be significantly less compared to the relative rotational speed of the substrate 251 and, in this case, appropriate measurement positions 244 may be obtained across the entire diameter of the substrate 251.

Figure 2C:
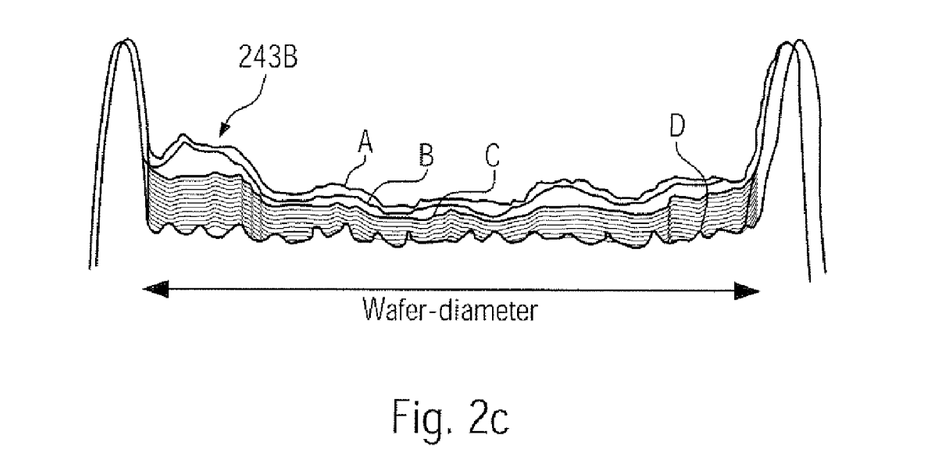
FIG. 2c schematically illustrates a plurality of measurement signals obtained during different phases of a polishing process, wherein each measurement signal represents a combination of measurement values obtained from radially different measurement positions, according to illustrative embodiments.

FIG. 2c schematically illustrates a plurality of responses 243B, represented by respective curves A, B, C, D, each of which may thus represent a combined response for the plurality of laterally different measurement positions 244. That is, each of the curves A, B, C, D may represent a characteristic indicating the current status of the removal process for each of the plurality of measurement positions 244. In the embodiment illustrated in FIG. 2c, the plurality of measurement positions 244 may extend substantially across the entire substrate diameter and may be provided with high spatial resolution, which may be illustrated as a substantially continuous distribution of the respective characteristic versus the radial position. For example, each of the curves A, B, C, D may represent the reflectance the corresponding radial measurement position 244 for an incoming optical beam, such as the probe signal 242a (FIG. 2a), wherein, if required, the reflectance may be determined on the basis of the intensity for a specified wavelength range, for a specified polarization and the like. Hence, the plurality of curves A, B, C, D may represent the time progression of the response 243B so that curve A may represent the spatially resolved response for a certain "point in time," while curve B may represent the response at a later "point in time." It should be appreciated that "point in time" is to be understood as a time interval required for obtaining the responses for each of the plurality of laterally different measurement positions 244. That is, each of the curves A, B, C, D represents a combined response including the positional information of the response within a time interval, which may be considered short compared to the overall polishing time and also compared to a final phase of the polishing process. Consequently, due to the increased spatial resolution of the responses 243B, a variation of the clearance behavior at the final phase of the polishing process may be identified with respect to the substrate 251 as a whole, when a significant portion of the lateral dimension is covered by the measurement distance 244A, and also of the individual die regions 250A, when at least a plurality of measurement points 244 are within the lateral dimensions of the individual die regions 250A. For example, as indicated by curves A, B, C, when the reflectance becomes increasingly smaller due to the increasing degree of clearance, as previously explained with reference to the layers 155 and 152 (FIGS. 1*b* and 1*c*), it may be recognized that the reflectance at a substrate center may be less compared to the substrate edge, thereby indicating that, in general, more exposed portions may be provided in the substrate center. This may be caused by an initial non-uniformity of the deposited layer and/or by a specific non-uniformity of the polishing process itself. On the other hand, curve D, which may represent the response 243B at a very late stage of the polishing process, may provide a substantially uniform reflectance on a global scale of the substrate 251, wherein also a certain degree of fine structure may be included, which may correspond to a difference in pattern density within the individual die regions 250A, as previously explained. Consequently, by monitoring the time variation of the response 243B, the current status of the polishing process may be estimated and an appropriate endpoint may be identified, for instance by determining a substantially non-changing behavior of the pattern within the curves A, B, C, D, which may therefore indicate that a time varying composition of the spatially varying reflectance may have ended. That is, the pattern, i.e., the various peaks and troughs in the response 243B for a cleared substrate, may have a constant distribution caused by the die grid and the pattern structure within the individual dies and the relative motion between the platen 220 and the substrate 251. However, prior to actually clearing the surface under consideration, a time varying distribution may be superimposed on the substantially constant distribution, due to the increasing degree of clearance, which may be different at different lateral positions, as previously explained. Thus, upon identifying a substantially constant pattern or distribution of the response 243B, an appropriate point in time may be identified in which a desired degree of clearance may be achieved while avoiding any additional over-polish time, which may be required in conventional strategies, as previously explained.

In one illustrative embodiment, the time variation of the response 243B may be monitored by selecting at least some intervals which may correspond to peak values and the like and to monitor the time variation of these intervals, wherein an endpoint may be determined when the time variation for each of the selected intervals is less than a predefined threshold. For example, a plurality of peak values may be identified in the curves A, B, C for a plurality of different substrate positions and the time variation of these peaks may be used for identifying a substantially time-invariable behavior of each of the respective intervals or peaks.

Figure 2D:
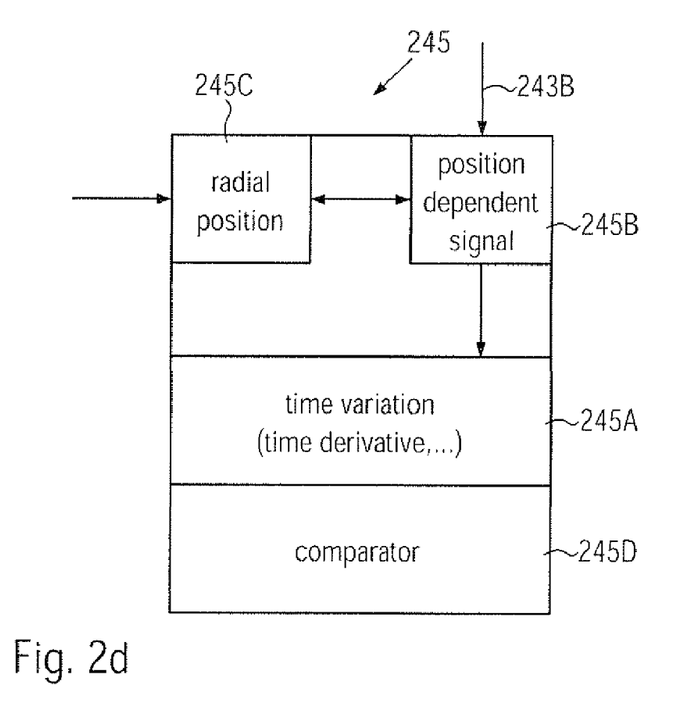
FIGS. 2d-2e schematically illustrate various configurations of a control unit used in the polishing tool of FIG. 2a in order to determine an appropriate endpoint for a polishing process, according to illustrative embodiments.

FIG. 2*d* schematically illustrates the control unit 245 according to one illustrative embodiment in which the above-described mechanism may be implemented. As illustrated, the control unit 245 may comprise a section 245B for receiving the response 243B in any appropriate format and provide a position-dependent signal or distribution, for instance in the form of the curves A, B, C, D as previously illustrated with reference to FIG. 2*c*. The section 245B may be coupled to a position verification unit 245C, which may receive position-sensitive information, for instance from the control unit 201 (FIG. 2*a*), which may also control the relative motion between the substrate 251 and the platen 220. For example, the response 243B may be provided as a substantially continuous signal, wherein the section 245C may provide a corresponding radial position associated with a specific value or value range of the response 243B, thereby providing position-dependent information in the section 245B. The information generated in the section 245B may be supplied to the section 245A configured to determine the time variation of the position-dependent information supplied by the section 245B. For example, as previously explained, a time derivative may be determined for specific intervals of the position-dependent information, for instance for respective peaks of the curves A, B, C, D. That is, for a specific radial position, the respective values associated with this position, such as the reflectance values and the like, may be monitored and a derivative of the corresponding "time function" may be determined. This may be performed for a plurality of peaks, thereby enabling the detection of a substantially stable behavior, as previously indicated. For example, a comparator 245D may be provided which may compare the respective time variation values, such as with derivatives, with a specific threshold to determine a "stable" configuration.

Figure 2E:
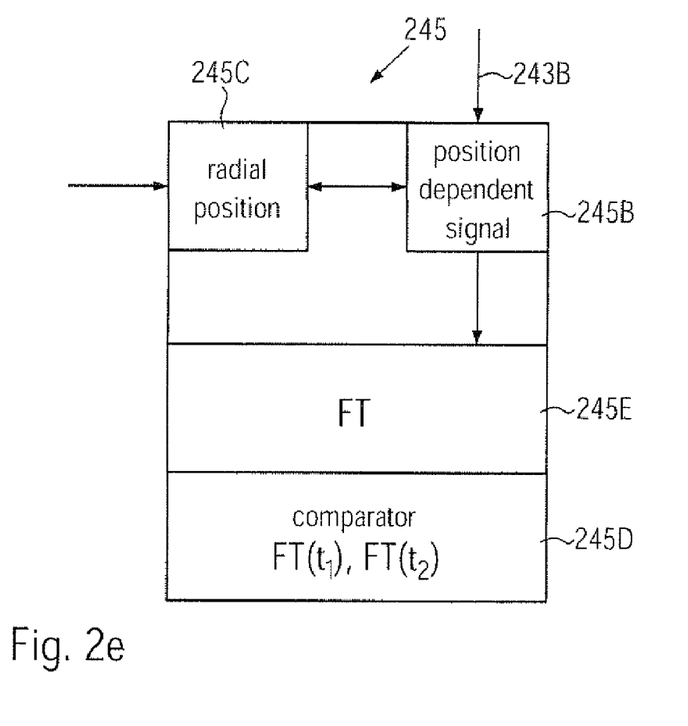

FIG. 2*e* schematically illustrates the control unit 245 according to still further illustrative embodiments in which the position-dependent information provided by the section 245B may be supplied to a Fourier transformation section 245E, which may provide a "frequency" distribution of the position-dependent information. That is, the Fourier transformation section 245E may provide the "spatial" frequencies contained in the position-dependent information, wherein the respective frequency distributions at different times may be compared in the comparator 245D to determine a substantially stable behavior of the spatial frequency components included in the position-dependent information. The provision of the Fourier transformation section 245E may enable enhanced identification of spatial frequency components, thereby also allowing enhanced monitoring of the time progression of these frequency components. That is, upon the intermediate final phase, a plurality of frequency components may still be present in the response, which may "vanish" when a substantially stable degree of clearance is achieved. Thus, upon monitoring the overall frequency distribution and in identification of a substantially stable shape thereof, the endpoint of the removal process may be identified with high accuracy.

Figure 2F:
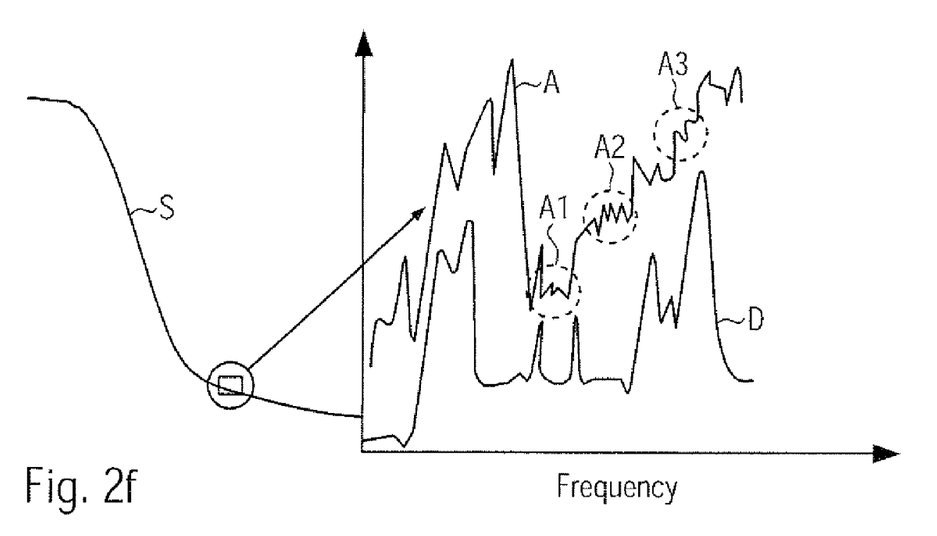
FIG. 2f schematically illustrates a combined measurement signal during various stages of the polishing process, wherein each combined measurement signal comprises position-dependent information with respect to a plurality of radially different measurement positions in the form of a Fourier transformed measurement signal, according to further illustrative embodiments.

FIG. 2*f* schematically illustrates corresponding frequency distribution provided by the Fourier transformation section 245E during various points in time. At the left-hand side of FIG. 2*f*, a typical endpoint detection signal S corresponding to a conventional strategy is illustrated, as also described with reference to FIG. 1*e*, while the right-hand side represents a frequency distribution A corresponding to a point in time as indicated by the circle and the graph of the right-hand side illustration of the conventional endpoint detection signal. Thus, in this phase, a plurality of spatial frequency components, as indicated by A1, A2, A3, may be present in the signal, which may become increasingly smaller and finally vanish at a later time, represented by curve D. Thus, curve D may represent the substantially completely cleared substrate surface and may therefore indicate an appropriate endpoint of the polishing process. It should be appreciated that a respective curve D may be obtained by performing experiments and providing a "smooth distribution" to enhance the identification of an appropriate endpoint on the basis of comparing the reference signal with respective measured signals, such as is illustrated by curve A. In other cases, a specific difference between subsequent frequency distributions may be determined and may be compared with a threshold so as to define a sufficient degree of stability of the corresponding frequency distribution, thereby indicating an appropriate endpoint of the polishing process.

In some illustrative embodiments, the position-dependent information, for instance represented by the frequency distributions A, D, may also be used for estimating characteristics of the removal process under consideration. For example, using one or more of the intervals A1, A2, A3, a pattern-depending removal rate may be determined while defining respective intervals in the position-dependent distribution, as, for instance, shown in FIG. 2c, a local removal rate may be determined, thereby also obtaining information on the characteristics of the removal process. For instance, as previously explained, a respective position-dependent removal rate may be used for controlling the polishing process, while also a pattern-dependent removal rate or any other characteristic extracted from the responses 243b may also be used for controlling one or more process parameters, such as downforce, relative speed and the like. Furthermore, the conditioning of the pad 224, possibly in combination with monitoring the characteristics of the slurry material, may also be established on the basis of respective information obtained by the position-dependent response 243b. For instance, identifying a significant change of the pattern-dependent removal rate, for instance increase of the removal rate above device regions having an increased pattern density, may be used for identifying a change of the overall process conditions, for instance with respect to the conditioning efficiency of the polishing pad 224 and/or the composition of the slurry material, the temperature thereof and the like.

It should be appreciated that the position-dependent response 243b may be obtained on the basis of a tool configuration, as may also be used in conventional strategies, wherein, additionally, the response 243b obtained by the detection system 240 may be associated with the current radial position across substrate 251, as previously explained. In other cases, the detection system 240 may be appropriately adapted to allow obtaining information associated with different radial positions, for instance by using appropriate scan regimes, using additional window portions, appropriately scanning the probe signal 242a and the like.

Figure 2G:
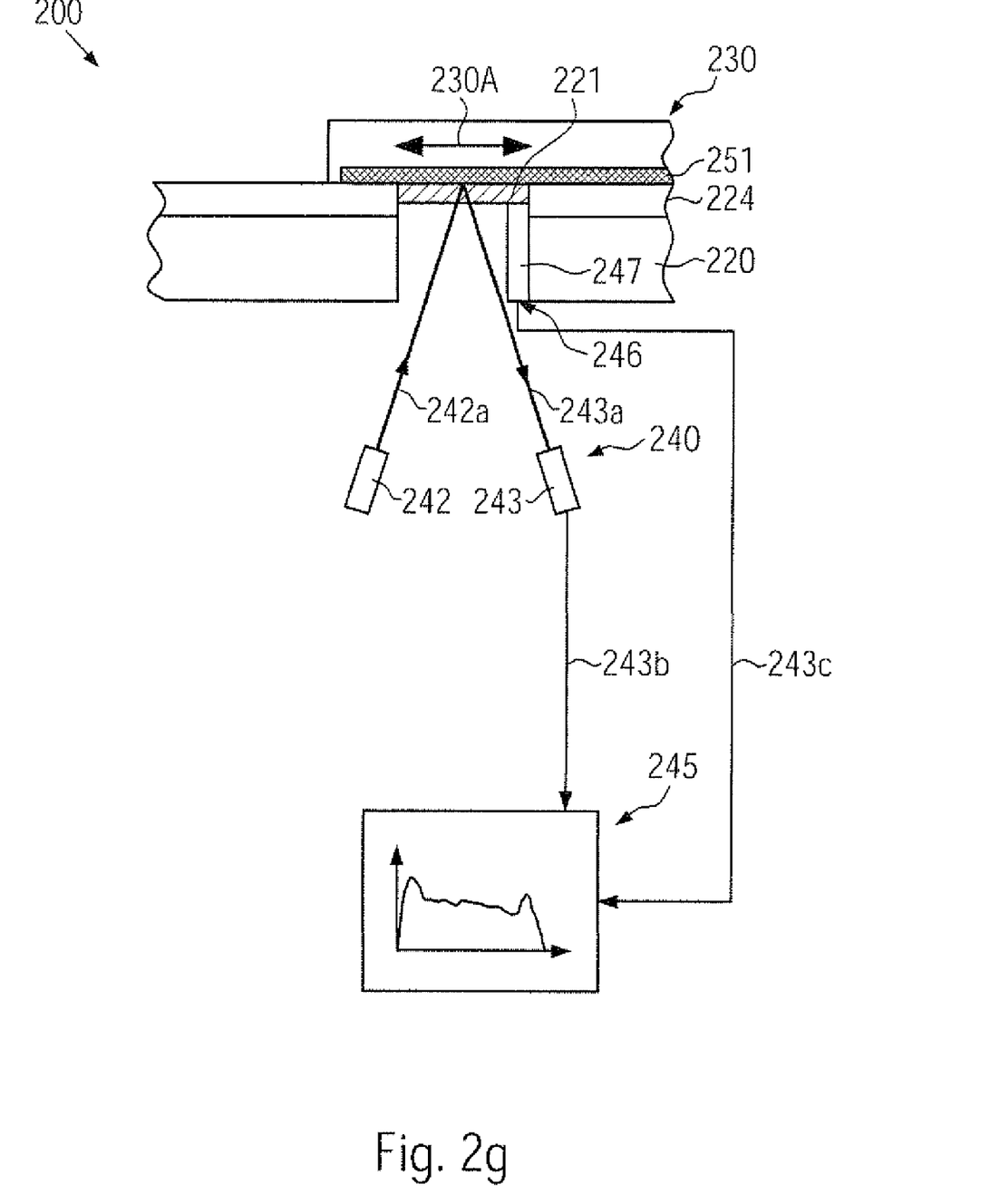
FIG. 2g schematically illustrates the polishing tool according to still further illustrative embodiments in which, additionally or alternatively to an optical detection system, a detection system may be provided in which inductive and/or capacitive coupling to the surface to be treated may be used.

FIG. 2g schematically illustrates the polishing tool 200 according to still further illustrative embodiments in which, additionally or alternatively to light source 242 and the detector 243, the detection system 240 may comprise a system 246 for providing inductive and/or capacitive coupling between the substrate 251 and a sensor 247. In one illustrative embodiment, the system 246 may comprise an excitation component for creating eddy currents in a surface area of the substrate 251, wherein the amount of eddy currents may depend on the amount of conductive material that is present in the vicinity of the sensor element 247. Thus, in this case, the response 243c may, additionally or alternatively, contain information of the degree of inductive and/or capacitive coupling to the surface to be treated, which may also be provided in the form of position-dependent information, as previously explained. For this purpose, the measurement of the sensor 247 may be associated with a corresponding position information that is related to the current position of the substrate 251 with respect to the platen 220 and thus to the sensor 247. Thereafter, the signal processing may be performed at the control unit 245 in a similar manner as explained above for the response 243b. It should be appreciated that, if essentially dielectric materials have to be treated during the removal process, a capacitive coupling may be measured which may vary depending on the amount of dielectric material present in the vicinity of the sensor element 247. Also, in this case, a respective signal evaluation may be performed to identify an appropriate endpoint. As illustrated, in some illustrative embodiments, an optical response and a response obtained by inductive and/or capacitive coupling may be combined to even further enhance the overall reliability of the respective endpoint detection.

As a result, the subject matter disclosed herein provides polishing tools and respective methods for operating the same, where a response to a probe signal may be obtained with increased spatial resolution, thereby enabling a more reliable detection of an endpoint. For this purpose, the response of different radial measurement positions may be evaluated with respect to the time variation thereof to determine the end of the removal process for a plurality of different positions, thereby enabling a substantially complete removal of unwanted material while substantially avoiding undue over-polishing of other device regions. The techniques disclosed herein may be advantageously applied to the formation of sophisticated metallization regimes and may also be used for evaluating the removal mechanism. Furthermore, the position-dependent information may also be used for controlling the removal process and/or a preceding deposition process in order to reduce the overall process non-uniformity, for instance by identifying a position-dependent point of time of clearance of the respective device regions, which may be used for appropriately adjusting the local removal rate and/or the local deposition rate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a removal process for removing material from a material layer formed above a substrate by providing relative movement between said substrate and a polishing pad, said substrate comprising a plurality of die regions;
    obtaining a measurement signal for each of a plurality of measurement positions laterally distributed across said substrate during the removal process, said plurality of measurement positions extending in a lateral direction according to a measurement distance that is at least as large as a lateral dimension of at least one of said plurality of die regions;
    forming a common measurement signal comprising said measurement signal for each of the plurality of measurement positions and position-dependent information associated with each of the plurality of measurement positions;
    monitoring a time progression of said common measurement signal; and
    determining an endpoint of said removal process on the basis of a change of said measurement signal from each of said plurality of measurement positions.

2. The method of claim 1, wherein said measurement distance approximately equals a radius of said substrate or more.

3. The method of claim 1, wherein said measurement signal represents an optical signal.

4. The method of claim 3, wherein said optical measurement signal represents a reflectance of a respective measurement position of said plurality of measurement positions in response to an optical probe signal directed to said respective measurement position.

5. The method of claim 1, wherein said measurement signal represents an electromagnetic signal created by at least one of inductive and capacitive coupling of a respective one of said plurality of measurement positions with an electromagnetic probe signal.

6. The method of claim 1, further comprising identifying one or more peak values of said combined measurement signal and determining a change in time of said one or more peak values.

7. The method of claim 6, wherein determining a change in time of said one or more peak values comprises monitoring a derivative of said one or more peak values.

8. The method of claim 6, wherein said endpoint is identified when the change in time for said one or more peak values is less than a predetermined threshold.

9. The method of claim 8, wherein said endpoint is identified when the change in time for said one or more peak values is substantially zero.

10. The method of claim 1, further comprising determining a distribution of frequency components in said common measurement signal and monitoring said distribution of frequency components over time to determine said endpoint.

11. The method of claim 1, further comprising selecting a specified spatial interval of said combined measurement signal and estimating at least one characteristic of said removal process on the basis of a temporal development of said specified spatial interval.

12. The method of claim 11, wherein said at least one characteristic comprises at least a local removal rate of said removal process.

13. The method of claim 10, further comprising selecting a specified frequency interval of said combined measurement signal and estimating at least one characteristic of said removal process by analyzing said specified frequency interval.

14. A method for determining an endpoint of a polishing process, the method comprising:
   determining a response of a substrate to a probe signal for a plurality of radially different measurement positions;
   forming a common measurement signal comprising said determined response at each of the plurality of measurement positions and information associated with a radius at each of the plurality of radially different measurement positions;
   determining a time variation of said common measurement signal; and
   indicating said endpoint when said time variation of said common measurement signal is less than a predetermined threshold.

15. The method of claim 14, wherein determining a time variation comprises determining a plurality of peak values in said common measurement signal and determining a time variation of said plurality of peak values.

16. The method of claim 14, wherein determining a time variation comprises performing a Fourier transformation on said common measurement signal and determining a time variation of at least some Fourier components.

17. The method of claim 14, wherein said response is obtained at least for a radial distance that corresponds to a lateral dimension of a die region formed in said substrate.

18. The method of claim 17, wherein said radial distance corresponds to approximately a radius of said substrate or more.

19. The method of claim 14, wherein said probe signal is an optical signal.

20. The method of claim 14, wherein said probe signal is an electromagnetic signal configured to couple with said plurality of radially different measurement positions by at least one of inductive and capacitive coupling.

21. A polishing system, comprising:
   a polishing tool comprising a polishing head for receiving a substrate and a polishing platen, said polishing tool being configured to establish a relative motion between said polishing head and said polishing platen;
   a detection system configured to provide a probe signal and to receive a response to said probe signal during said relative motion; and
   a control unit operatively connected to said polishing tool and said detection system and configured to control said polishing tool and said detection system to obtain said response for a plurality of radially different measurement positions, form a common measurement signal comprising said determined response at each of the plurality of measurement positions and information associated with a radius at each of the plurality of radially different measurement positions, and to monitor a time variation of said common measurement signal.

22. The polishing system of claim 21, wherein said control unit is further configured to determine a time derivation of a plurality of peak values contained in said common measurement signal.

23. The polishing system of claim 21, wherein said control unit is further configured to determine a Fourier transformed response from said common measurement signal.

24. The polishing system of claim 21, wherein said detection system comprises a generator for providing said probe signal as an optical signal and an optical receiver for receiving said response as an optical response.

* * * * *